United States Patent [19]
Tseng

[11] Patent Number: 5,547,890
[45] Date of Patent: Aug. 20, 1996

[54] DRAM CELL WITH A CRADLE-TYPE CAPACITOR

[75] Inventor: Horng-Huei Tseng, Hsin Chu, Taiwan

[73] Assignee: Vanguard International Semiconductor Corporation, Hsinchu, Taiwan

[21] Appl. No.: 435,197

[22] Filed: May 5, 1995

[51] Int. Cl.$^6$ .................... H01L 21/70; H01L 27/00
[52] U.S. Cl. .................... 437/52; 437/47; 437/60; 437/919
[58] Field of Search .................... 437/47, 52, 60, 437/919; 257/300, 303, 306, 309

[56] References Cited

U.S. PATENT DOCUMENTS 5,266,514  11/1993  Tuan et al. .................... 437/52
5,286,668   2/1994  Chou et al. .................... 437/52
5,292,677   3/1994  Dennison .................... 437/52
5,336,638   8/1994  Suzuki et al. .................... 437/919

*Primary Examiner*—H. Jey Tsai
*Attorney, Agent, or Firm*—George O. Saile

[57] ABSTRACT

An efficient method for manufacturing a cradle-shape capacitor for use as part of a DRAM cell in a silicon integrated circuit is described. The effective area of the capacitor plates is increased by providing a trench along the center of the capacitor which has the form of a polysilicon rectangular prism. The trench is formed by locating a heavily doped layer of silicon oxide on the surface and then heating the structure to a degree sufficient to cause significant outdiffusion of dopant from the silicon oxide into the polysilicon. A selective etching procedure is then used to remove only the area into which dopant has diffused, thereby creating the aforementioned trench.

17 Claims, 5 Drawing Sheets

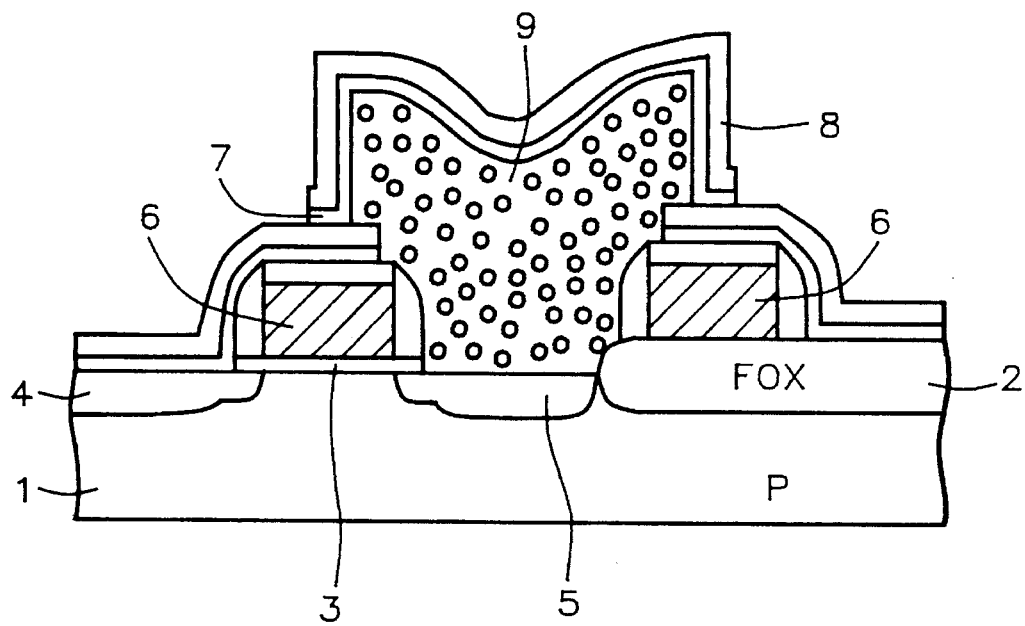
FIG. 1 – Prior Art
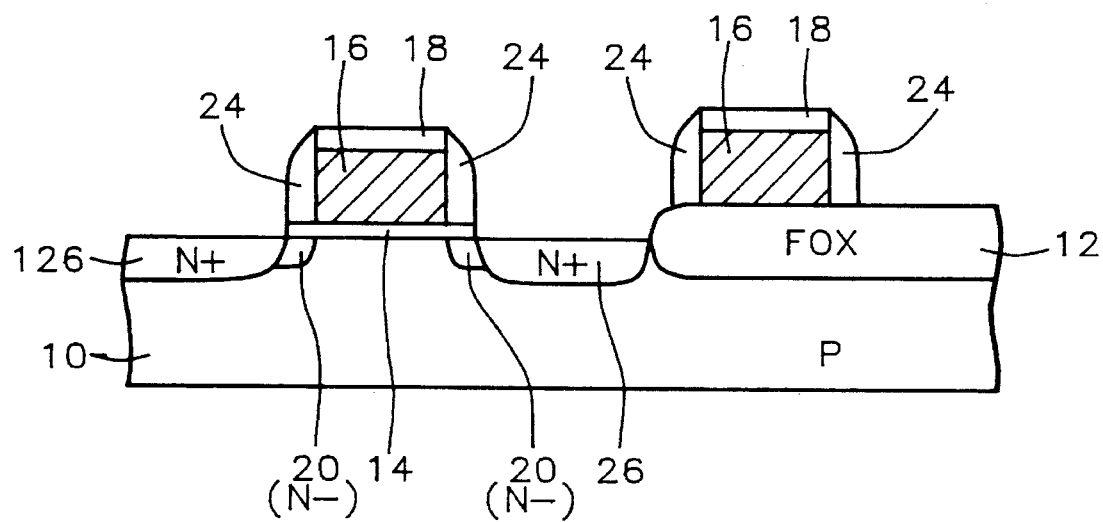
FIG. 2

DRAM CELL WITH A CRADLE-TYPE CAPACITOR

BACKGROUND OF THE INVENTION (1) Field of the Invention

The invention relates to the general field of silicon integrated circuits, more particularly to Dynamic Random Access Memories and capacitors used therein.

(2) Description of the Prior Art

Dynamic Random Access Memories (DRAMs), as used in silicon integrated circuits, represent semiconductor devices that offer information storage at very high densities. These high densities are a consequence of the fact that the basic cell of a DRAM (wherein a single bit of information is stored) comprises a single Field Effect Transistor (FET) and a capacitor. The minimum capacitance required for the basic cell to operate efficiently is about femtofarads. This implies that the capacitor, rather than the FET, will be the limiting factor in determining how small the DRAM's basic cell can be made.

Capacitance value can be increased in any of three ways: the dielectric layer may be made thinner, the dielectric constant may be increased, and the area of the electrodes may be increased. The first two ways are limited by the availability of materials with suitable properties such as breakdown strength, high frequency characteristics, etc. so that most of the work to reduce the physical size of the capacitor in a DRAM cell has concentrated on increasing the effective area of the electrodes without increasing the amount of space within the integrated circuit that is taken up by the capacitor.

One of the geometries that has been successfully used to increase the effective area of the capacitor electrodes is to shape the capacitor in the form of a rectangular prism, at least one of whose surfaces is dimpled in some way such as rectangular or cylindrical depressions. The cradle-type capacitor is an example of this and is the geometry on which the present invention is based.

Dennison (U.S. Pat. No. 5,292,677 Mar. 8, 1994) describes processes that relate primarily to the DRAM cell as a whole, but also includes an example of a cradle-type capacitor. This is illustrated in FIG. 1. Shown in schematic cross-section is a single DRAM cell comprising an FET with source and drain electrodes, 5 and 4 respectively, a layer of gate oxide 3 and a gate electrode 6. Said gate electrode, when seen in plan view (not shown) has the shape of a hollow rectangle. One side of said hollow rectangle rests on gate oxide layer 6 while the opposite side rests on field oxide layer 2. The interior of the hollow rectangle is filled with layer 9 of polycrystalline silicon (poly) which is heavily doped (as symbolized by the small bubble-like dots) and serves as a bottom electrode for the DRAM capacitor while at the same time contacting source region 5.

Continuing reference to FIG. 1, said bottom electrode has been coated with dielectric layer 7 followed by a second layer of poly 8 which serves as the top electrode of the capacitor. The dip in the center of layers 7, 8, and 9 has a cradle-like appearance, hence the name cradle-like capacitor. In the Dennison process this dip is the result of layers 7, 8, and 9 following the natural contours of the structure, particularly the interior of the hollow rectangle. Thus it is relatively limited in extent and so increases the effective area of the capacitor electrodes by only a relatively small amount.

SUMMARY OF THE INVENTION

It has been an object of the present invention to describe an efficient method for manufacturing a cradle-type capacitor.

A further object of the present invention has been to further increase the effective area of the capacitor electrodes by providing a deeper indentation in the surface of the capacitor than has been achieved in previous versions of a cradle-type capacitor.

These objects have been achieved by using the following steps:

(a) providing a partially completed silicon integrated circuit structure comprising a plurality of FETs, each having source, drain, and gate regions, the electrode contacting said gate region having the shape of a hollow rectangle, one side contacting said gate region and the parallel side on a layer of field oxide, adjacent to said gate region and separated from it by said source region;

(b) then coating the structure with a first layer of silicon nitride and then with a first layer of silicon oxide;

(c) then coating the structure with a first layer of photoresist, patterned to protect only those parts of said first layers of silicon nitride and silicon oxide that overlie said gate electrode, then removing the unprotected areas of said first layers and then stripping said first layer of photoresist;

(d) then coating the structure with a first layer of undoped poly and with a second layer of silicon oxide, said second layer being heavily doped with an N type dopant;

(e) then coating the structure with a second layer of photoresist, patterned to protect only those parts of said layer of poly and said second layer of silicon oxide that overlie the interior of said gate, overlapping said first layer of silicon oxide, and then removing the unprotected areas of said first and second layers of silicon oxide and said first layer of poly;

(f) then anisotropically etching said patterned second layer of photoresist, thereby symmetrically reducing its width and exposing portions of said second layer of silicon oxide on either side of said photoresist pattern;

(g) then removing the unprotected portion of said second layer of silicon oxide down to the level of said first layer of poly and then stripping said second layer of photoresist;

(h) then subjecting the structure to a heat treatment such that said N type dopant material diffuses out of said second layer of silicon oxide into said first layer of poly;

(i) then subjecting the structure to a selective etching treatment wherein the portion of said first layer of poly into which N type dopant has diffused is selectively removed;

(j) then impregnating said first layer of poly with an N type dopant, thereby reducing its electrical resistivity and forming it into a bottom electrode;

(k) then coating said bottom electrode with a layer of a capacitor dielectric; and (l) then coating said capacitor dielectric layer with a second layer of polycrystalline silicon, thereby forming a top electrode.

BRIEF DESCRIPTION OF THE DRAWINGS

FIG. 1 shows a form of cradle-type capacitor as described in the prior art.

FIG. 2 is a schematic cross-section through a partially completed silicon integrated circuit, representing the starting point for the present invention.

DESCRIPTION OF THE PREFERRED EMBODIMENTS

Figure 3:
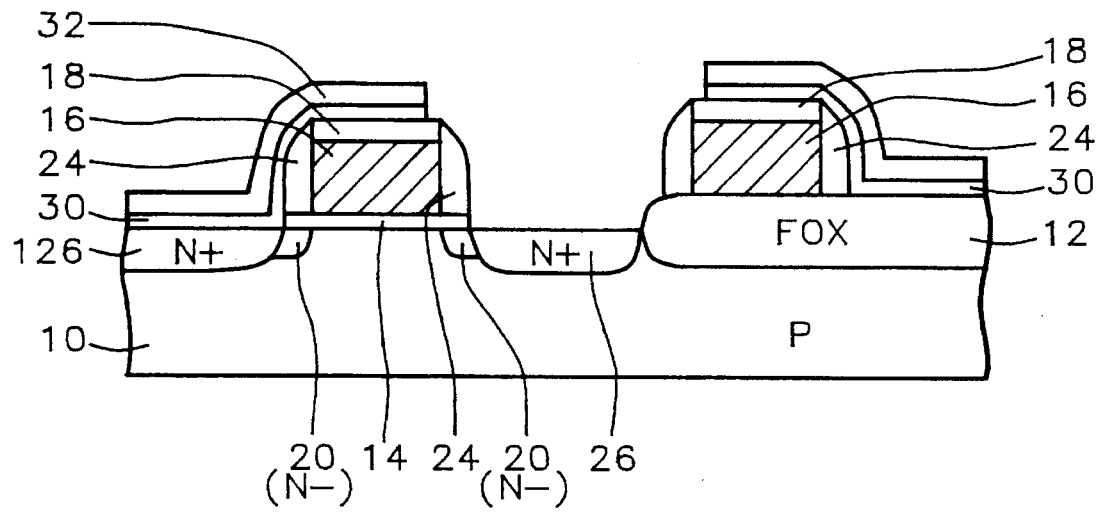
FIGS. 3 through 9 show succesive steps (all as schematic cross-sections) that comprise the method of the present invention.

This description of the preferred method for manufacturing the cradle-type capacitor begins at a point in the manufacturing process where the integrated circuit is partially completed and comprises a plurality of Field Effect Transistors (FETs), each of which will form a single cell of the DRAM in combination with a cradle-type capacitor.

Referring now to FIG. 2 we show, in schematic cross-section, a single FET formed on silicon body 10. The particular example shown here is of an FET that was produced by the Low Density Drain Self Aligned silicide (LDD salicide) process, but it will be understood by anyone skilled in this art that the capacitor forming method that is about to be described will work just as well for other types of FET, including both N-P-N and P-N-P types. Shown in FIG. 2 is source region 26, drain region 126 and gate oxide 14. Regions 26 and 126 each comprise N+ silicon (in this example). In addition, a small subregion of N– silicon 20 underlies oxide spacers 24.

Gate electrode 16 in FIG. 2 has the shape of a hollow rectangle. In the cross-section used here, one edge of this rectangle is shown to overlie the gate oxide 14 while the parallel edge is shown as overlying Field Oxide (FOX) 12. The object of the method is to build the capacitor in the interior of the hollow rectangle that comprises the gate electrode.

Referring to FIG. 3, the method begins with the deposition of a layer of silicon nitride 30 followed by a first layer of silicon oxide 32. Standard photolithographic and etching techniques were then used to remove said layers from the interior of the hollow rectangle that comprises gate electrode 16. The method that was used to deposit the silicon nitride layer comprised Low Pressure Chemical Vapor Deposition (LPCVD) using a mix of $SiH_4$ and $NH_3$ at a pressure of 350 millitorr and a temperature of 720° C., while the silicon oxide layers were deposited through LPCVD using a mix of $N_2O$, $SiH_4$, and $O_2$ at a pressure of 250 millitorr and temperature of 720° C. Their thicknesses were between 300 and 800 Angstrom units for the silicon nitride layer and between 500 and 2,000 Angstrom units for the oxide layer.

Figure 4:
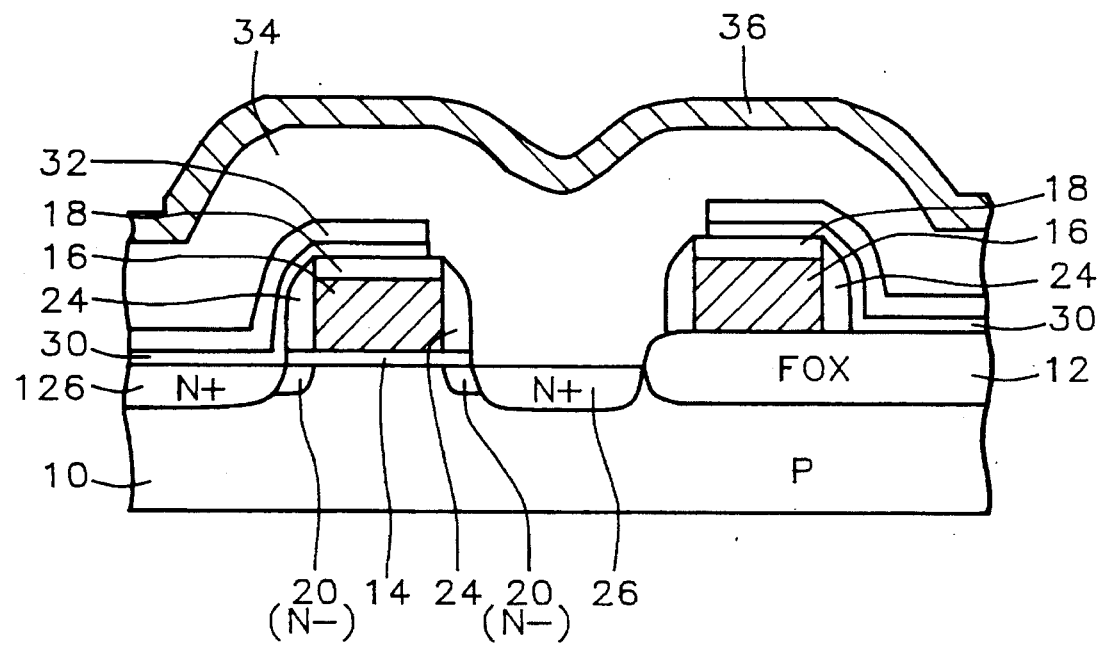

Referring to FIG. 4, the next step was to deposit a first layer of undoped polycrystalline silicon (poly) 34 by means of LPCVD using $SiH_4$ at a pressure of 180 to 220 millitorr and a temperature of 560° to 680° C. to a thickness between 3,000 and 8,000 Angstrom units followed by second silicon oxide layer 36 to a thickness of between 1,000 and 4,000 Angstrom units. Said second layer of silicon oxide was heavily doped with an N type dopant such as arsenic or phosphorus to concentrations between $10^{20}$ and $10^{22}$ atoms/cc. The preferred method for its formation was Atmospheric Pressure CVD (APCVD) or LPCVD.

Figure 5:
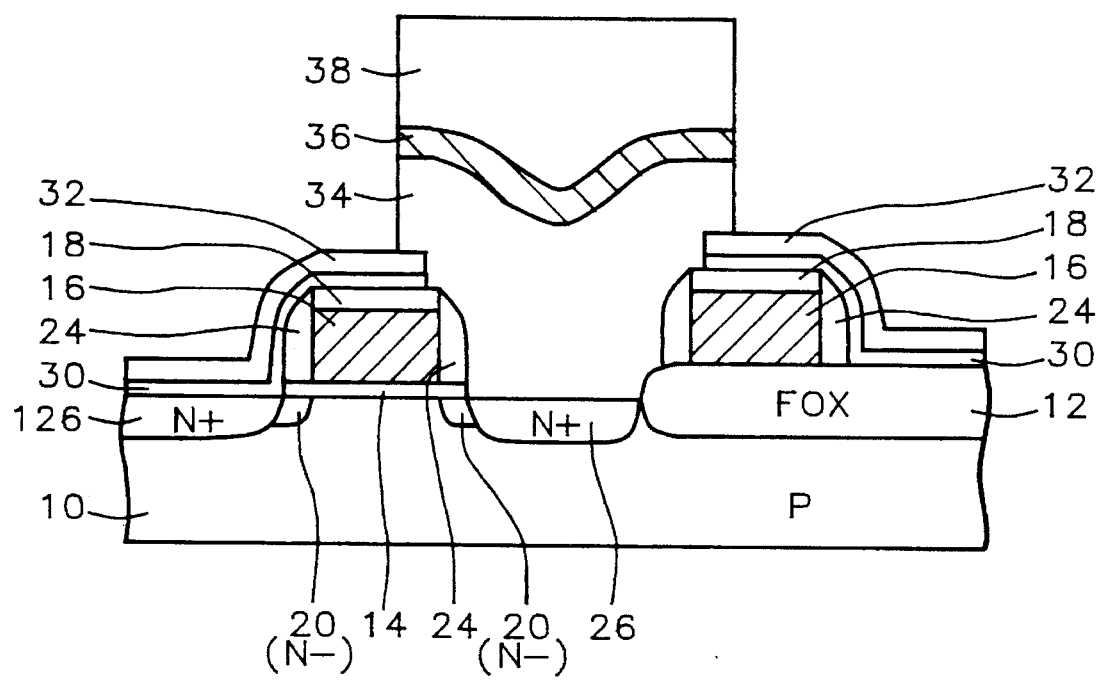

A photoresist mask 38 (see FIG. 5) was now applied and both oxide layer 36 and poly layer 34 were etched away everywhere except within the interior of the hollow rectangle that comprised gate electrode 16. A small amount of overlap of first oxide layer 32 by first poly layer 34 was also provided. This was followed by an etching step to remove the unprotected portions of silicon oxide layers 32 and 36 and poly layer 34. At the completion of this etch the structure had the appearance shown in FIG. 5. Note the overhang in the area where layer 34 had previously overlapped layer 32.

Figure 6:
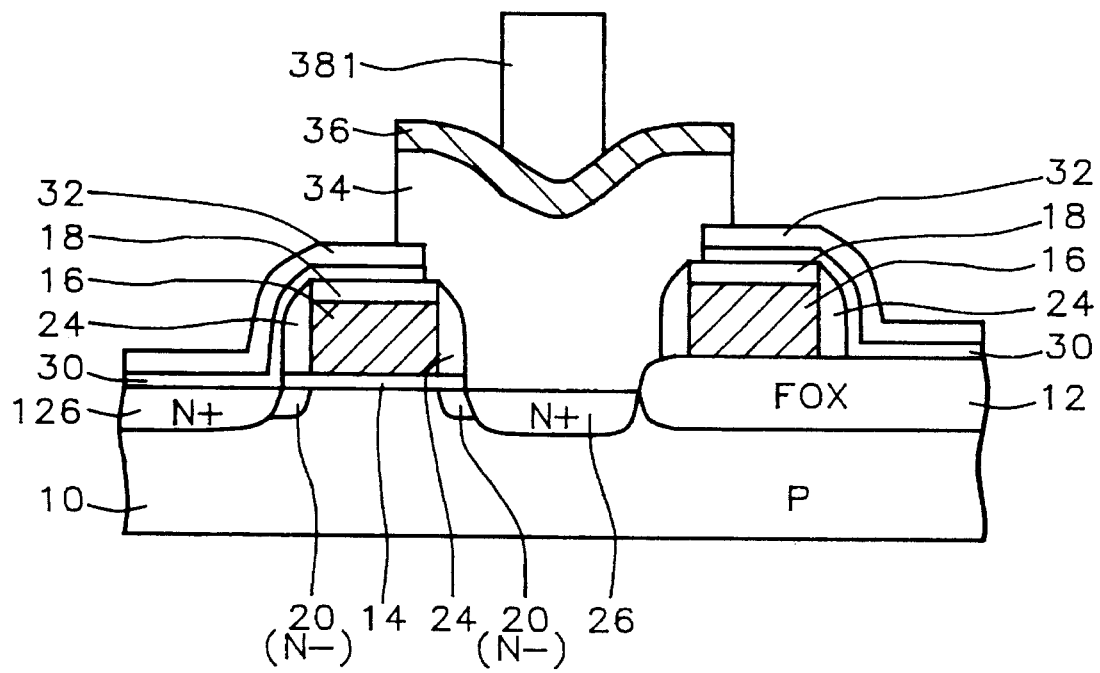

Once this was done, photoresist mask 38 was isotropically etched in an oxygen plasma so that its side surfaces were preferentially removed relative to its top surface, giving it the appearance shown in FIG. 6 where it is designated as 381. With photoresist mask 381 in place, second (heavily doped) oxide layer 36 was removed by etching in hydrofluoric acid which does not attack pure silicon. After photoresist layer 381 had been stripped from the structure it had the appearance shown in FIG. 7. Note the presence of layer 361 which represents what was left of second oxide layer 36 after etching.

Figure 7:
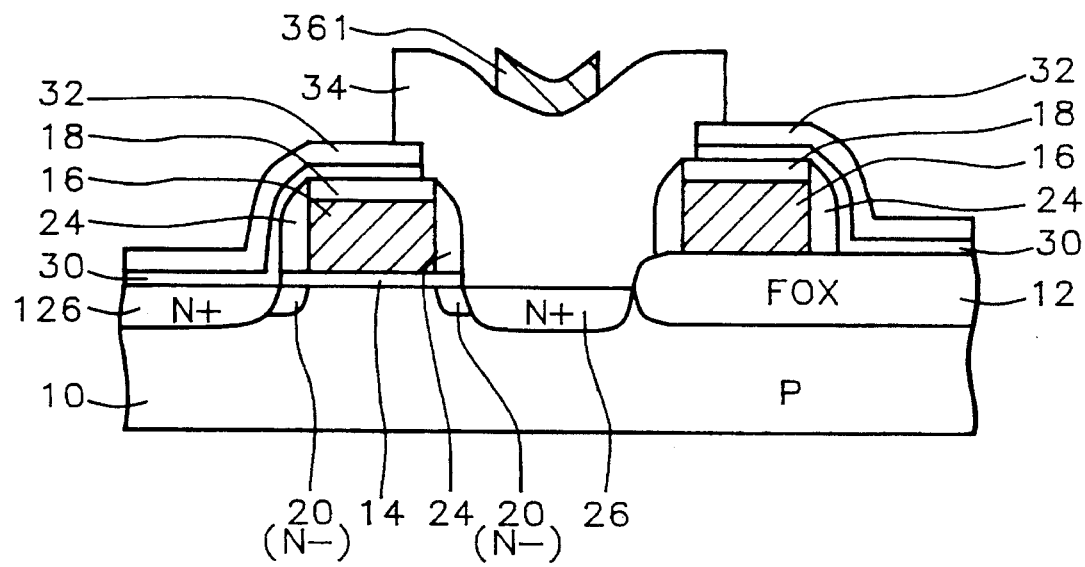
Figure 8:
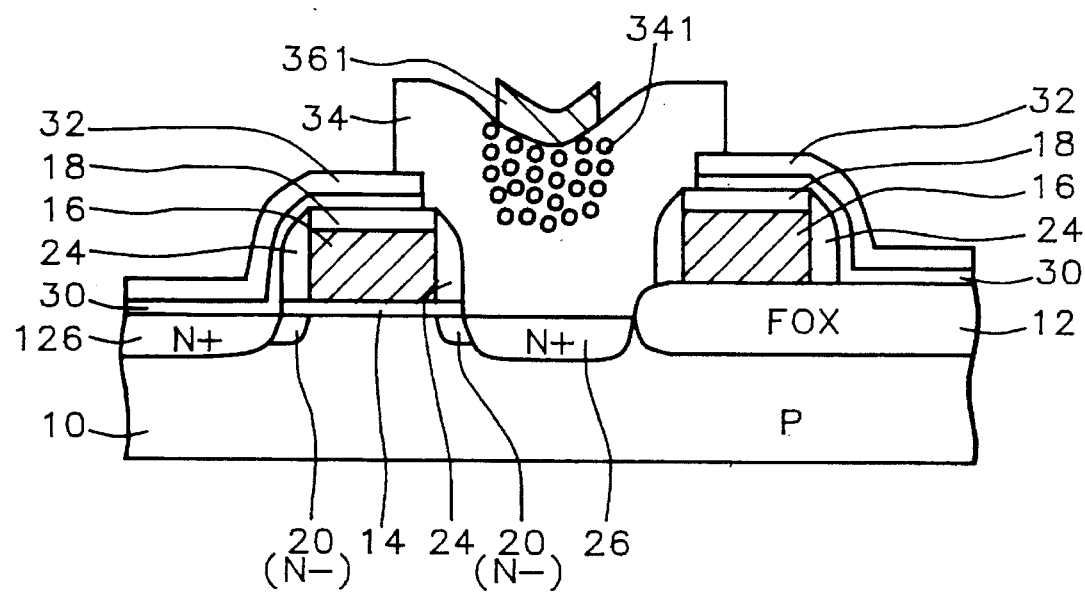

The structure of FIG. 7 was now heated in nitrogen for between 30 and 120 minutes at a temperature between 800° and 950° C. This heat treatment caused N type dopant from within 361 to diffuse into undoped first poly layer 34 creating a region 341 in its immediate vicinity that was strongly N type. Region 341 is illustrated in FIG. 8 by means of tiny bubble-like dots.

Figure 9:
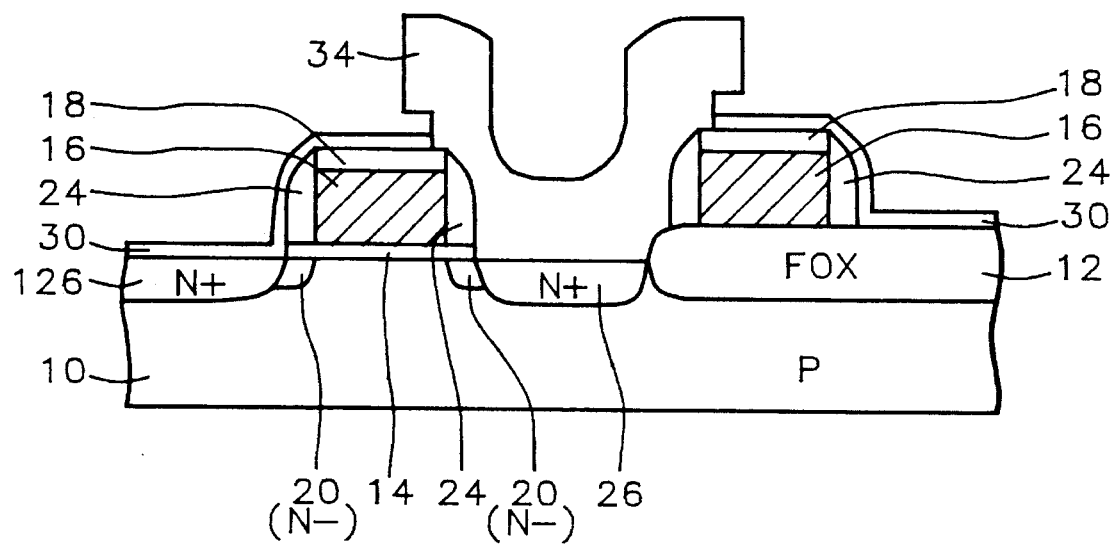

Following the formation of region 341, doped second oxide layer 361 was removed by etching in hydrofluoric acid. The structure was then subjected to a selective etching process comprising immersion in a solution of phosphoric acid at a temperature between 160° and 190° C. for from 30 to 120 minutes. This etching treatment leaves pure (undoped) silicon intact but removes N+ silicon that has a dopant concentration in excess of about $10^{20}$ atoms/cc. At the completion of the selective etching treatment the structure had the appearance shown in FIG. 9. Viewed in plan (not shown) first poly layer 34 now had the appearance of a cradle. In order for layer 34 to be ready to serve as a bottom electrode for the capacitor its resistivity had to be reduced. This was achieved by ion implanting or otherwise impregnating either phosphorus or arsenic.

Figure 10:
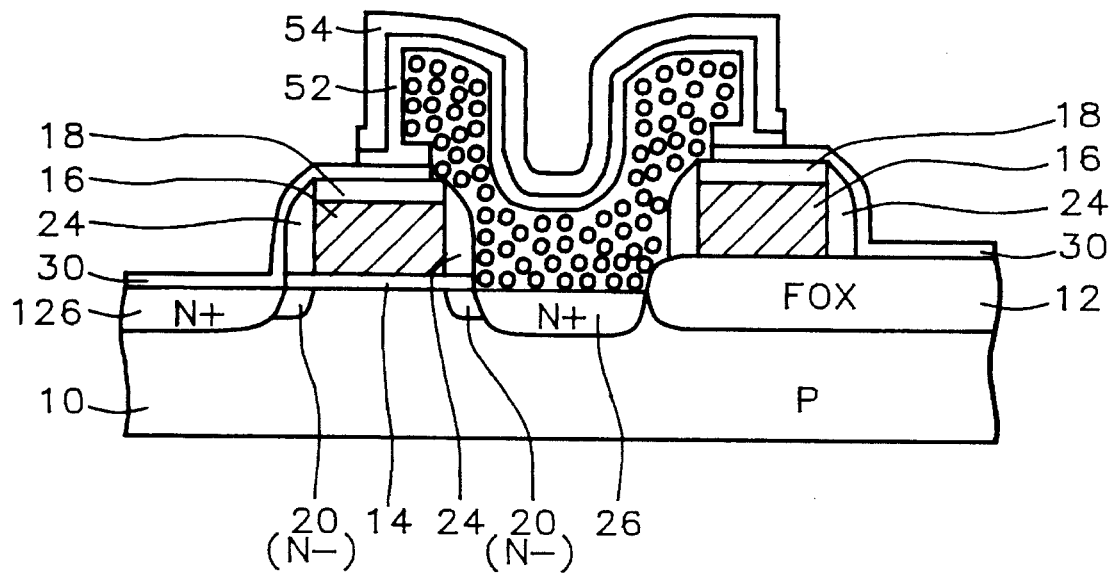
FIG. 10 is a schematic cross-section of the end-product of the present invention.

Referring now to FIG. 10, a capacitor dielectric layer 52 was conformally deposited onto the surface of said bottom electrode (now suitably doped as illustrated by the pattern of bubble-like dots) to a thickness between 10 and 90 Angstrom units. Our preferred material for layer 52 has been a triple layer comprising $SiO_2/Si_3N_4/SiO_2$ (ONO), but any suitable dielectric material such as Tantalum Oxide could be used. The preferred method for depositing ONO layer 52 has been:

Bottom O—expose poly to deionized water

Middle N—Low Pressure CVD, silane and ammonia, between 700° and 800° C., 330 to 400 millitorr Top O—heat in dry oxygen, between 800° to 900° C. for 25 to 35 minutes.

To complete fabrication of the capacitor a second poly layer 54 was deposited over dielectric layer 52 to a thickness between 1,000 and 3,000 Angstrom units, thereby providing a top electrode.

While the invention has been particularly shown and described with reference to this preferred embodiment thereof, it will be understood by those skilled in the art that various changes in form and details may be made without departing from the spirit and scope of the invention.

What is claimed is:

1. A method of manufacturing a cradle-shape capacitor as part of a Dynamic Random Access Memory cell, comprising:

(a) providing a partially completed silicon integrated circuit structure comprising a plurality of Field Effect Transistors, each transistor having source, drain, and gate regions, said gate region having a first gate electrode formed on a gate oxide and a second gate electrode formed on a field oxide, said first and second gate electrodes are separated by said source region;

(b) then coating the structure with a first layer of silicon nitride and then with a first layer of silicon oxide;

(c) then coating the structure with a first layer of photoresist, patterned to protect only those parts of said first layers of silicon nitride and silicon oxide that overlie said first and second gate electrodes, then removing unprotected areas of said first layer of silicon nitride and said first layer of said silicon oxide thereby exposing said source region and then stripping said first layer of photoresist;

(d) then sequentially coating the structure with a first layer of undoped polycrystalline silicon and a second layer of silicon oxide, said second layer of silicon oxide being doped with an N type dopant;

(e) then coating the structure with a second layer of photoresist, patterned to protect only those parts of said first layer of undoped polycrystalline silicon and said second layer of silicon oxide that overlie said source region, and then removing unprotected areas of said first and second layers of silicon oxide and said first layer of undoped polycrystalline silicon;

(f) then isotropically etching said patterned second layer of photoresist, thereby symmetrically reducing its width and exposing portions of said second layer of silicon oxide on either side of said second layer of photoresist pattern;

(g) then removing the exposed portion of said second layer of silicon oxide down to said first layer of undoped polycrystalline silicon and then stripping said second layer of photoresist;

(h) then subjecting the structure to a heat treatment such that said N type dopant diffuses out of said second layer of silicon oxide into said first layer of undoped polycrystalline silicon;

(i) then subjecting the structure to a selective etching treatment wherein a portion of said first layer of undoped polycrystalline silicon into which N type dopant has diffused is selectively removed;

(j) then impregnating said first layer of undoped polycrystalline silicon with another N type dopant, thereby reducing its electrical resistivity and forming it into a bottom electrode;

(k) then coating said bottom electrode with a layer of a capacitor dielectric; and (l) then coating said capacitor dielectric layer with a second layer of polycrystalline silicon, thereby forming a top electrode.

2. The method of claim 1 wherein coating first undoped polycrystalline silicon comprises Low Pressure Chemical Vapor Deposition using $SiH_4$ at a pressure 180 and 220 millitorr and a temperature between 560° and 680° C.

3. The method of claim 1 wherein coating said first layer of silicon oxide and said first layer of silicon nitride comprises chemical vapor deposition.

4. The method of claim 1 wherein coating said doped second layer of silicon oxide is Atmospheric Pressure Chemical Vapor Deposition or Low Pressure Chemical Vapor Deposition.

5. The method of claim 1 wherein a thickness of said first layer of polycrystalline silicon is between 3,000 and 8,000 Angstrom units.

6. The method of claim 1 wherein a thickness of said first layer of silicon oxide is between 500 and 2,000 Angstrom units.

7. The method of claim 1 wherein a concentration of said N type dopant in said second layer of silicon oxide, prior to the heat treatment, is between $10^{20}$ and $10^{22}$ atoms/c.c.

8. The method of claim 1 wherein a thickness of said second layer of silicon oxide is between 1,000 and 4,000 Angstrom units.

9. The method of claim 1 wherein isotropically etching patterned second photoresist layer comprises exposure to an oxygen plasma.

10. The method of claim 1 wherein the heat treatment step comprises heating the structure at a temperature between 800° and 950° C. for between 30 and 120 minutes in an atmosphere of nitrogen.

11. The method of claim 1 wherein the selective etching treatment comprises etching in phosphoric acid at a temperature between 160° and 190° C. for from 30 to 120 minutes.

12. The method of claim 1 wherein forming said bottom electrode by impregnating it with an N type dopant comprises ion implantation of an N type dopant.

13. The method of claim 1 wherein a material that comprises said capacitor dielectric layer is selected from the group consisting of silicon dioxide, silicon nitride, and tantalum oxide.

14. The method of claim 1 wherein a thickness of said capacitor dielectric layer is between 10 and 90 Angstrom units.

15. The method of claim 1 wherein coating said capacitor dielectric further comprises:

exposing said second layer of polycrystalline silicon to deionized water;

performing Low Pressure CVD, using silane and ammonia, at between 700° and 800° C. at between 300 and 400 millitorr;

and heating in dry oxygen at between 800° and 900° C. for between 25 and 35 minutes.

16. The method of claim 1 wherein a thickness of said second layer of polycrystalline silicon is between 1,000 and 3,000 Angstrom units.

17. The method of claim 1 wherein said N type dopant is arsenic or phosphorus.

* * * * *